United States Patent
Pauly

(10) Patent No.: US 10,833,014 B2
(45) Date of Patent: Nov. 10, 2020

(54) ELECTRICAL INTERCONNECTION COMPRISING A TOPOLOGICAL INSULATOR MATERIAL

(71) Applicant: IEE INTERNATIONAL ELECTRONICS & ENGINEERING S.A., Echternach (LU)

(72) Inventor: Christian Pauly, Luxembourg (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 16/484,890

(22) PCT Filed: Feb. 12, 2018

(86) PCT No.: PCT/EP2018/053437
§ 371 (c)(1),
(2) Date: Aug. 9, 2019

(87) PCT Pub. No.: WO2018/146307
PCT Pub. Date: Aug. 16, 2018

(65) Prior Publication Data
US 2019/0385950 A1 Dec. 19, 2019

(30) Foreign Application Priority Data

Feb. 13, 2017 (LU) .................................. 100 076
Apr. 20, 2017 (LU) .................................. 100 174

(51) Int. Cl.
*H01L 23/528* (2006.01)
*H01L 23/532* (2006.01)

(52) U.S. Cl.
CPC ...... *H01L 23/5283* (2013.01); *H01L 23/5329* (2013.01)

(58) Field of Classification Search
CPC . H01L 23/522; H01L 23/528; H01L 23/5283; H01L 23/5329; H01L 23/53295;
(Continued)

(56) References Cited

U.S. PATENT DOCUMENTS 9,490,430 B1 * 11/2016 Chen ................. H01L 29/78648
2012/0138887 A1 6/2012 Zhang et al.
(Continued)

OTHER PUBLICATIONS

Li, Chuan and de Ronde, Bob and Nikitin, Artem and Huang, Yingkai and Golden, Mark S. and de Visser, Anne and Brinkman, Alexander; Interaction between counter-propagating quantum Hall edge channels in the 3D topological insulator BiSbTeSe2; Phys. Rev. B 2017, 96, 195427) (Year: 2017).*
(Continued)

*Primary Examiner* — Mohammed Shamsuzzaman
*Assistant Examiner* — Aaron J Gray
(74) *Attorney, Agent, or Firm* — Reising Ethington P.C.

(57) ABSTRACT

An electrical interconnection. In order to efficiently conduct electrical current in small-scale structures and at high frequencies, the electrical interconnection has a channel portion which includes at least one channel layer made of a weak topological insulator material and having a top surface with a plurality of grooves extending from a first terminal to a second terminal of the electrical interconnection, wherein the top surface and a bottom surface of each groove are insulating, whereas each side surface of each groove includes a conducting zone with a pair of topologically protected one-dimensional electron channels.

14 Claims, 5 Drawing Sheets

(58) Field of Classification Search
CPC ......... H01L 35/16; H01L 35/18; H01L 35/32; B82Y 10/00; B82Y 40/00
USPC ..................................... 257/773, 750, 741
See application file for complete search history.

(56) References Cited

U.S. PATENT DOCUMENTS

| | | |
|---|---|---|
| 2012/0161209 A1 | 6/2012 | Yazdani et al. |
| 2016/0035674 A1* | 2/2016 | Zhang ............... H01L 23/53271 257/750 |
| 2020/0006618 A1* | 1/2020 | Pauly ..................... H01L 35/32 |

OTHER PUBLICATIONS

Viktor Krueckl and Klaus Richter; Switching Spin and Charge between Edge States in Topological Insulator Constrictions; Physical Review Letters; 107, 086803 (2011) (Year: 2011).*
Yukinori Yoshimura, Akihiko Matsumoto, Yositake Takane, and Ken-Ichiro Imura, Physical Review B 88, 045408 (2013) (Year: 2013).*
International Search Report corresponding to International application No. PCT/EP2018/053437, dated May 7, 2018, 3 pages.
Written Opinion corresponding to International application No. PCT/EP2018/053437, dated May 7, 2018, 5 pages.
W. Steinhögl et al., "Comprehensive Study of the Resistivity of Copper Wires with Lateral Dimensions of 100nm and Smaller", J. Appl. Phys. 97, 023706, 2005.
A. Naeemi et al., "Conductance Modeling for Graphene Nanoribbon (GNR) Interconnects", IEEE Electron Devices, Letters, vol. 28, No. 5, pp. 428-431, 2007.

* cited by examiner

ELECTRICAL INTERCONNECTION COMPRISING A TOPOLOGICAL INSULATOR MATERIAL

TECHNICAL FIELD

The invention relates to an electrical interconnection and to an integrated circuit comprising such an electrical interconnection.

BACKGROUND OF THE INVENTION

At the present state of computer chips performance, industry is more and more reaching fundamental limits so that Moore's law, which states that the number of transistors on a microprocessor chip doubles every 18 months to two years, will inevitably come to an end. Top-of-the-line microprocessors currently have circuit structures which are around 14 nm across. A scaling down of these structures to less than 10 nm would not only require huge efforts and costs in adapting the established manufacturing techniques, but would also involve the appearance of quantum physics effects which come into play and which compromise and alter the functionalities of the standard materials employed in these structures.

One major issue which comes along with the downscaling of microprocessor structures is the increased heat dissipation which strongly reduces the performance. In the case of copper, which beside aluminum, is the state of the art material for interconnections due to its large electrical conductivity, scaling down to sizes below 100 nm leads to significant resistance increases. In fact, the resistivity of the material increases due to so-called size effects which include diffuse electron-surface scattering, enhanced scattering at grain boundaries and surface roughness-based scattering [J. Appl. Phys. 97, 023706 (2005); IEEE Electron Dev. Lett. 28, 428 (2007)]. For instance, a resistivity increase from approx. $2.5 \cdot 10^{-8}$ $\Omega$m to approx. $8.3 \cdot 10^{-7}$ $\Omega$m is observed for a copper wire as its width is reduced from 100 nm to 10 nm. Efforts have been made to bypass the need of down-scaling for performance improvement e.g. by structuring 3D architectures, such that more capacity can be packed in the same space, however this hardly reduces the major drawback of heat dissipation.

Beside the enhanced signal resistance which is due to a downscaling of interconnecting structures, the resistance of a standard metal interconnection also drastically increases if an alternating current (AC) of high frequency is transmitted (e.g. in metallic transmission lines which connect an antenna to a receiver or emitter circuit). The reason is the so-called skin effect which causes that the AC current is pushed to the periphery of the conductor, such that the effective cross-section of the conductor given by the so-called skin depth is reduced. In the case of a copper conductor for instance, the skin depth shrinks from approx. 8.6 mm at 60 Hz to approx. 65 nm at 1 THz so that the effective AC resistance of the conductor is strongly enhanced since the resistance is inversely proportional to the (effective) cross-sectional area. In general, the AC resistance is many times higher than the DC resistance, so that a much higher energy loss due to ohmic heating is observed. This issue for instance greatly affects transmission lines in the telecommunication area where a power matching between a transmitting conductor and a low ohmic receiver or emitter decreases for high frequency signals.

US 2012/0161209 A1 discloses an interconnect with enhanced immunity of electrical conductivity to defects, wherein the interconnect comprises a material with charge carriers having topological surface states. One embodiment shows a multi-layer structure with a plurality of layers made with interconnects fabricated from a material exhibiting electrical conduction in topological surface states.

US 2012/0138887 A1 discloses an electrical device comprising a current transport layer formed using a layer of a topological material, and at least one electrode in electrical contact with the current transport layer. Among others, the topological material may be a two-dimensional or three-dimensional topological insulator.

US 2016/0035674 A1 discloses an electrical circuit with a magnetically dope topological insulator form of a plurality of layers, each layer having conductive edges with insulative properties between the edges. The different layers are created by varying the magnetic dopant density while the topological insulator is grown. A first electrode contacts a first set of edges of the layers and a second electrode contacts the second set of edges.

SUMMARY

It is thus an object of the present invention to provide means for efficiently conducting electrical current in small-scale structures and at high frequencies. This object may be solved by an electrical interconnection according to claim 1 and by an integrated circuit according to claim 13.

The invention provides an electrical interconnection. In general, the term "electrical interconnection" refers to an element that can be employed and is adapted to electrically connect at least two other elements or electrical components. In other words, the electrical interconnection is adapted to conduct electrical current between these elements. Examples for electrical components which may be connected are transistors, processors, memory devices, filters etc.

The electrical interconnection has a channel portion which comprises at least one channel layer made of a weak topological insulator material. The term "weak topological insulator material" herein refers to a material that has an insulating interior and some surfaces which are conducting, while other surfaces are insulating. In particular, it depends on the orientation of a particular surface whether it is conducting or insulating. Examples of weak topological insulator materials that may be used include $Bi_{14}Rh_3I_9$, $KHgSb$, $Bi_2TeI$, $Bi_1Te_1$ and $Bi_4I_4$. However, other three-dimensional topological materials may be suitable, too. In general any topological materials which exhibits 1D topological edge states should be taken into account for the present invention.

Each channel layer has a top surface with a plurality of grooves extending from a first terminal to a second terminal of the electrical interconnection. Normally, a dimension of the channel layer perpendicular to the top surface (i.e. the thickness of the channel layer) is considerably less than any dimension along the top surface (i.e. the length or width of the channel layer). In particular, the thickness of the channel layer may be less than 20 nm, less than 10 nm or even less than 5 nm. As is understood, the grooves (which may also be referred to as trenches) are elongate depressions or recesses within the top surface. The cross-section of the grooves may be rectangular, having side surfaces extending perpendicular to the top surface and a bottom surface extending in parallel to the top surface. It should be noted that the cross section of the grooves does not necessarily be rectangular. Other forms are also suitable as long as a defined step edge of at least 1 atomic layer of a 1D edge state will be present. The depth of a groove (i.e. its dimension perpendicular to the top surface) may be less than 5 nm, less than 2 nm or even less than 1 nm. The depth may correspond to the thickness of one atomic layer or only a few atomic layers. The term "top surface" is not to be construed in a limiting way and simply serves to denote this surface within a reference frame where it is the uppermost surface of the channel layer. It is understood that in operational state, the top surface may be facing sideways or even downwards. Preferably, the top surface is planar, apart from the above-mentioned grooves. During a manufacturing process, each channel layer may be formed by deposition processes like and electron beam epitaxy while the grooves may be formed by nano-structuring methods including but not restricted to photolithography, e-beam-lithography, or scanning probe microscopy scratching.

The first and second terminals are adapted for connection to other electrical components. These are the parts of the electrical interconnection where, in operational state, an electric potential is applied and an electric current flows into or out of the interconnection. In other words, the electric current flows from the first terminal to the second terminal (and/or vice versa). When the electrical interconnection is used to connect two electronic components (e.g. transistors, diodes etc.), the first terminal is at least indirectly connected to one element while the second terminal is at least indirectly connected to the other element. Each of the grooves extends from the first terminal to the second terminal, i.e. the grooves start at one terminal and end at the other terminal. One may also say that the grooves are connected in parallel between the first terminal and the second terminal.

The top surface and a bottom surface of each groove are insulating, whereas each side surface of each groove comprises a conducting zone with a pair of one-dimensional electron channels. The weak topological insulator material is manufactured so that the top surface and any surface parallel to it are electrically insulating. Other surfaces, in particular surfaces perpendicular to the top surface, may be conducting. The bottom surface of each groove runs along the same direction as the top surface. In particular, the bottom surface may be parallel to the top surface. Thus, the top surface and each bottom surface are insulating.

The side surfaces of the grooves, which may be perpendicular to the top surface, are at least partially conducting. More specifically, each side surface comprises a conducting zone with a pair of topologically protected one-dimensional electron channels. In this context, "side surface" of course refers to those surfaces of the groove that extend from the top surface "downwards", i.e. away from the top surface. Even though the inside of the weak topological insulator is insulating, the side surfaces are at least partially conducting and allow for a movement of electrons along the length of the groove. In particular, electrons may move in either direction, i.e. from the first terminal to the second terminal or vice versa, but the current in either direction will be spin-polarized. In other words, electrons flowing from the first terminal to the second terminal will have a spin that is anti-parallel to the spin of electrons flowing from the second terminal to the first terminal. Thus, each conducting zone comprises a pair of one-dimensional electron channels.

A special property of weak topological insulators is that each of these electron channels has a quantized conductance of $e^2/h$ (h being the Planck constant) and that electrons within these channels are protected against backscattering, such that nearby dissipationless conductance over several hundred of nanometers at room temperature can be anticipated. In other words, the conductance does not substantially depend on the length, the depth or the width of the groove. Therefore, the cross-section of each groove can be minimized without affecting the conductance as long as two neighboring electron channels are not overlapping. The spatial extension of the 1D electron channels depends on their spatial density of states and is for the material $Bi_{14}Rh_3I_9$ in the range of one nanometer only. Size effects that are relevant for conventional metal conductors have much less influence on the electron channels. Thus, the minimal size of the grooves is mostly limited by the manufacturing process. Also, due to nanometer-scale effective cross-section of the electron channel, the conductance of the electron channels is mainly independent of the frequency of the electrical current, in contrast to conventional metal conductors which, at higher frequencies, are affected by the skin effect.

While the conductance of a single groove is rather small, the total conductance of the inventive interconnection can be considerably higher, since the first and second terminal are connected by a plurality of grooves. Similarly, the resistance of the current through the electron channels is drastically reduced by the connection of a plurality of grooves. As the width and depth of the grooves can be in the order of a few nanometers, it is possible to dispose a relatively large number of grooves on a small channel layer. The number of grooves connecting the first and second terminal may be at least 5, at least 10 or at least 20. Since the electron channels of all these grooves are connected to the same pair of terminals, crosstalk effects between neighboring channels are usually negligible.

A characteristic feature of weak topological insulator materials is that electrons in the electron channels behave as massless Dirac fermions and move at the high speed of the Fermi velocity, which is of the order of $10^5$ m/s. The high velocity of the electrons as well as their topological protection against backscattering leads to long mean free paths (e.g. several hundreds of nanometers at room temperature), wherefore the interconnection can work at very high bandwidths (like the THz regime). In addition, due to the large Fermi velocity of the one-dimensional electron channels, high switching times in the range of femtoseconds (for an interconnection of 1 μm length) are in principle feasible, which is considerably faster than with metal interconnections known in the art.

Due to the specific nano-patterning of the weak topological insulator surface, which results in the connection of a plurality of highly conductive 1D electron channels in parallel, the inventive interconnection is less power consuming due to a reduced resistivity and therefore dissipates less heat as compared to metal interconnections known in the art. Also, it can carry higher current densities and can execute operations in a faster way, thereby improving clock rates. It is suitable for transmission of high frequency AC signals without being affected by the skin effect, thus enabling good resonator and impedance conversion properties in principle up to $10^{15}$ Hz.

According to a preferred embodiment, the first terminal comprises a first electrode made of metal and the second terminal comprises a second electrode made of metal, wherein the grooves of at least one channel layer extend from the first electrode to the second electrode. Suitable metals for each of the electrodes are e.g. gold, copper, aluminum and silver. In the manufacturing process of the interconnection, each electrode may be formed by known additive techniques directly on the channel layer. In this embodiment, the grooves of the above-mentioned at least one channel layer are connected in parallel between the first and second electrode. Although the electrodes are "ordinary" metal conductors, the cross section of the respective electrode can be relatively large compared to the cross-section of the individual grooves, while it may be considerably shorter than each of the grooves. Therefore, any detrimental effect on the total conductivity of the interconnection can be limited.

In order to avoid any interference between the one-dimensional electron channels, it is preferred that all grooves of one channel layer are spaced-apart. In other words, these grooves do not branch, intersect each other or contact each other. Moreover, there is normally a minimal spacing necessary in order to avoid overlapping or hybridizing of electron channels in neighboring grooves. However, the spacing between two grooves may be rather small and may be similar to the width of the individual groove. Preferably, the spacing as well as the width may be less than 10 nm or less than 5 nm, but at minimum 3 nm as the spatial extension of the 1D electron channels in weak topological insulators is of the order of 1 nm. It should be noted that in some embodiments, the spacing may be smaller than the width of the individual groove.

In order to optimally use the available space on the upper surface of the channel layer and to maximize the overall current density as well as to minimize the overall resistance, it is preferred that at least some of the grooves of one channel layer run in parallel. In particular, all grooves of one channel layer may run parallel. For instance, the grooves may correspond a plurality of parallel straight lines along the upper surface. More generally, even if the grooves are not straight, "running parallel" means that the grooves are connected by the same two terminals and that the spacing between two neighboring grooves is constant over the length of these grooves and that the grooves connect the same two terminals.

While the electrical interconnection may be realized with a single channel layer, it is highly preferred that the interconnection comprises a plurality of channel layers arranged in a stacked manner. This means that the plurality of channel layers is arranged above each other along a direction perpendicular to the upper surfaces of the layers. Normally, two neighboring channel layers are spaced-apart. There is no actual limitation to the total number of channel layers. For instance, the interconnection may comprise 2 to 100, or more specifically 5 to 50 channel layers depending on the application and requirement of the signal transfer. As will be explained further in the following, at least some of the channel layers, or even all of them, may be identical. In particular, one and the same weak topological insulator material may be used for every channel layer.

In this embodiment, grooves of different channel layers extend from the first terminal to the second terminal. In other words, grooves belonging to different channel layers are connected in parallel between the first and second terminal. It is understood that this increases the overall conductance and reduces the overall resistance of the electrical interconnection with respect to the first and second terminal. For instance, when using 10 identical channel layers, the conductance can be increased and the resistance decreased by a factor of 10. As will be explained in the following, however, other channel layers may comprise grooves that do not extend from the first terminal to the second terminal.

Preferably, at least some of the grooves in a plurality of (i.e. at least two) different channel layers run parallel. In particular, all grooves in a plurality of different channel layers can run parallel. It is possible that grooves in different channel layers are horizontally offset with respect to each other (wherein the upper surface defines the horizontal direction). However, the manufacturing process can be facilitated if all of the plurality of layers are identical, so that grooves in different channel layers are disposed vertically above each other.

Normally, two neighboring channel layers are separated by an insulating layer, which comprises an insulating material different from the weak topological insulator material. The term "insulating" herein refers to an electrical insulator, which normally has a conductivity of less than $10^{-8}$ S·cm$^{-1}$ During the manufacturing process, one channel layer may be created by a deposition process whereafter the grooves are created by a suitable ablative process. Afterwards, a layer of insulating material is disposed on the upper surface where the position processes may be used that are suitable for creating the channel layers. Normally, the insulating material is also placed within the grooves, i.e. between the side surfaces. Due to its insulating property, it does not allow for any (or at least any substantial) current between the opposite side surfaces. Therefore the electron channels in different side surfaces remain insulated from each other.

It is preferred that the insulating material has a rather low relative permittivity such that a capacitive coupling between adjacent electron channels is minimized. More particularly, the relative permittivity may be less than 10, preferably less than 5. One example of such a material is silicon dioxide, which has a relative permittivity of about 3.9.

If the electrical interconnection is used to connect only two electronic components, it may have only two terminals, i.e. the first and second terminal. However, it is possible to connect more than two components. According to a preferred embodiment, the electrical interconnection comprises at least one first channel layer having grooves extending from the first terminal to the second terminal and at least one second channel layer having grooves extending from a third terminal to a fourth terminal of the electrical interconnection, wherein at least one of the third and fourth terminal is different from the first and second terminal. In such an embodiment, different channel layers are employed to connect different terminals. At least one first channel layer, normally a plurality of first channel layers, is used to connect the first and second terminal, while at least one second channel layer, normally a plurality of second channel layers, is used to connect the third and fourth terminal. It is possible that one of the third and fourth terminal is in fact identical to the first (or the second) terminal. In such an embodiment, electrical signals from e.g. the first terminal, which can be connected to a first electronic component, may be transferred separately to the second and third terminal, which can be connected to a second and third electronic component, respectively.

According to another embodiment, both of the third and fourth terminal are different from the first and second terminal, e.g. when four different electronic components are to be connected. Either way, the at least one first channel layer and the at least one second channel layer are arranged in a stacked manner and can be separated by insulating layers as described above, whereby two different electrical connections are formed with the corresponding grooves possibly even "crossing" each other along the horizontal direction, while they are separated along the vertical direction. This "crossing" architecture can be very space-saving. For example, four electrical components to be connected can be located on the same plane, which leads to a more efficient space filling of the integrated circuit.

The grooves in the first channel layer are normally at an angle to those in the second channel layer. In particular, this angle may be 90°, i.e. the grooves may be perpendicular to each other. In such an embodiment, the four terminals may be located on four different sides of the interconnection.

Similar to the first and second terminal, it is preferred that the third terminal comprises a third electrode made of metal and the fourth terminal comprises a fourth electrode made of metal. The same metals can be used as for the first and second terminal.

Since the edges of each channel layer can also be conducting like the side surfaces of the grooves, it is reasonable to keep them separate from any terminal other than the terminals to which the grooves of the respective channel layer are connected. Such a separation can be achieved by interposing the above-mentioned insulator material. According to such an embodiment, each first channel layer is separated from at least one of the third and fourth terminal by the insulator material and each second channel layer is separated from at least one of the first and second terminal by the insulator material.

If the electrical interconnection comprises a plurality of first channel layers and a plurality of second channel layers, there are a multitude of possibilities how these layers may be arranged above each other. According to one preferred embodiment, the first and second channel layers are disposed alternatingly. In other words, a first channel layer is disposed between two second channel layers and vice versa. It is understood that every first channel layer is normally separated from a neighboring second channel layer by an insulating layer.

The invention also provides an integrated circuit which comprises an inventive electrical interconnection. In such an integrated circuit, a first electronic component may be connected to the first terminal and a second electronic component may be connected to the second terminal.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

Figure 1:
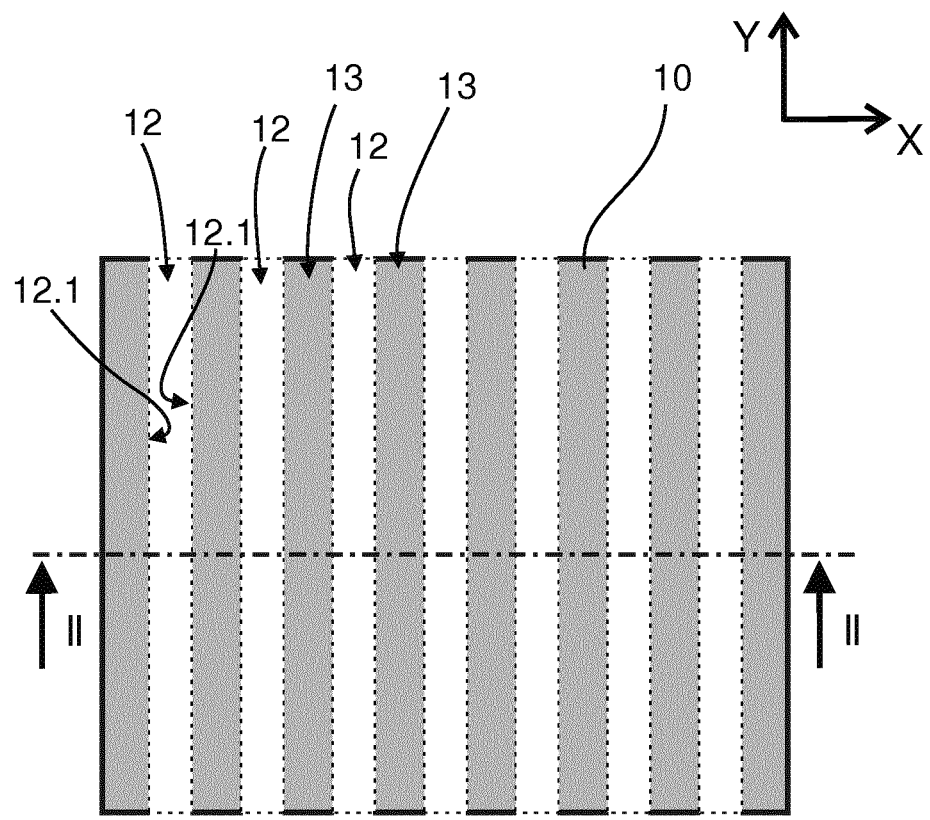
FIG. 1 is a schematic top view of a channel layer for an electrical interconnection according to the invention.
Figure 2:
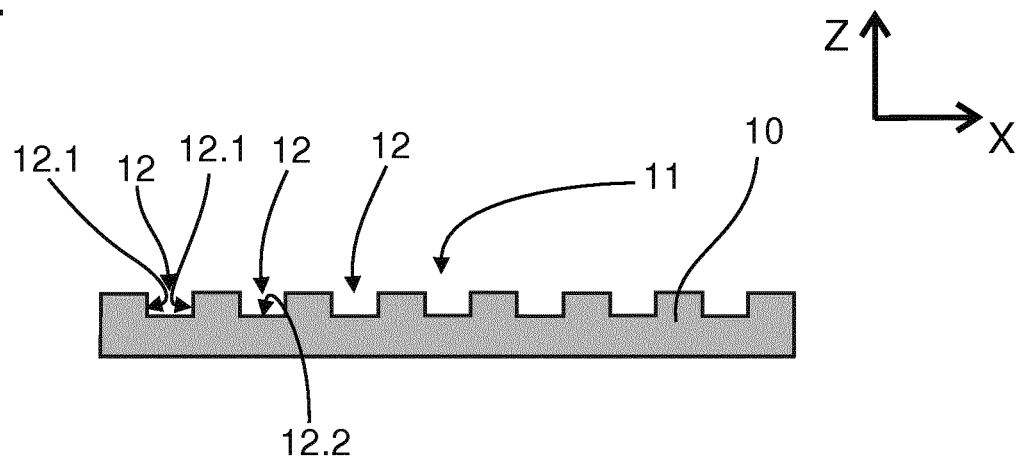
FIG. 2 is cross-sectional view according to the line II-II in FIG. 1.

FIGS. 1 and 2 show a schematic representation of a first channel layer 10 for an electrical interconnection according to the present invention. For ease of reference, a coordinate system with X-, Y- and Z-axis is shown in all figures. The first channel layer 10 has a flat, roughly rectangular shape extending along the X-axis and Y-axis. An upper surface 11 of the first channel layer 10 extends along the X-Y-plane (which can also be referred to as the horizontal plane) and faces in the Z-direction. It should be noted that the dimensions of the embodiment in the figure are not to scale. The total length (along the Y-axis) and width (along the X-axis) of the first channel layer 10 may be e.g. several hundred of nanometers and 15 nm, respectively, and its thickness (along the Z-axis) may be e.g. 3 nm. A plurality of straight grooves 12 running along the Y-direction are disposed within the upper surface 11. Each of these grooves 12 has a rectangular cross-section with side surfaces 12.1 extending along the Y-Z-plane and a bottom surface 12.2 extending along the X-Y-plane. The width of each groove 12 may be e.g. 2 nm while its depth may be 1 nm but at least the distance between two atomic layers. Two neighboring grooves 12 are separated by a ridge 13 having a width that may be equal to the width of each groove 12.

Figure 3:
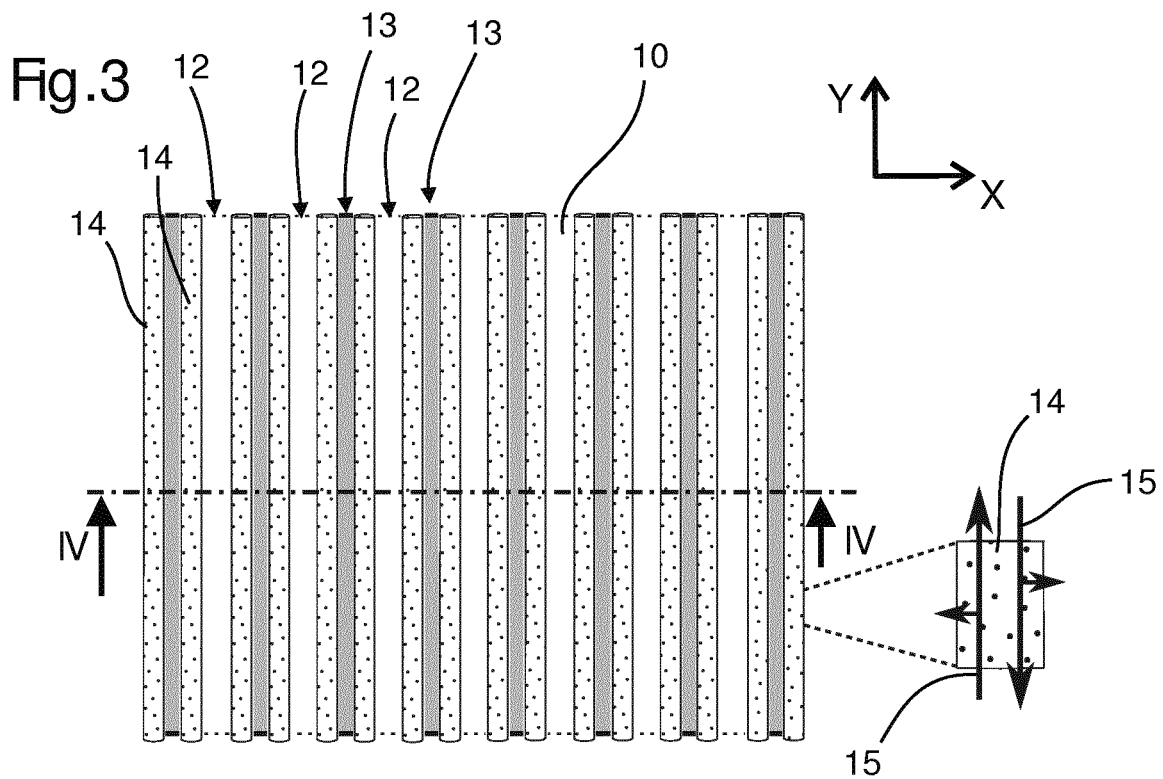
FIG. 3 is a schematic top view similar to FIG. 1 illustrating conducting zones.
Figure 4:
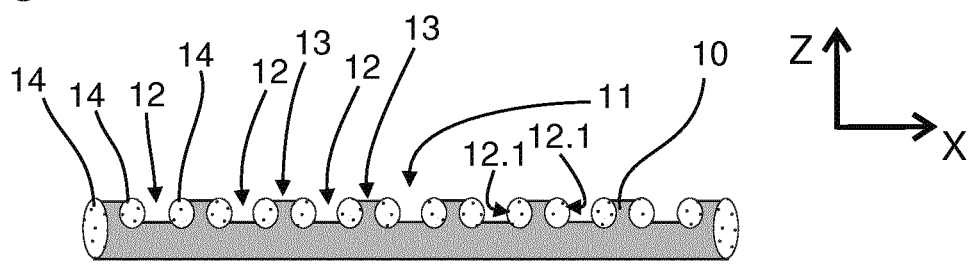
FIG. 4 is a cross-sectional view according to the line IV-IV in FIG. 3.

The first channel layer 10 is made of a weak topological insulator material, e.g. $Bi_{14}Rh_3I_9$. During the manufacturing process, it may be formed by a deposition processes like electron beam epitaxy while the grooves 12 may be formed afterwards by nano-structuring methods like photolithography, electron-beam lithography or scanning probe microscopy scratching. The use of a weak topological insulator material combined with the structure of the first channel layer 10 leads to a special electrical conduction behavior which is illustrated in FIGS. 3 and 4. While the upper surface 11 as well as the bottom surfaces 12.2 of each groove 12 are electrically insulating, every side surface 12.1 of the grooves 12 comprises an electrically conducting zone 14 with a pair of topologically protected one-dimensional electron channels 15 which are schematically shown in FIG. 3. It is understood that the conducting zones 14 are only illustrated schematically and that their actual size and shape may be different depending on the specific weak topological insulator material. It should however be noted, that a fingerprint of weak topological insulators is that the spatial density of states is very narrow, such that the grooves can be made very narrow as well. Each electron channel 15 allows for a propagation of electrons in the positive or negative Y-direction, respectively. Each electron channel 15 is spin-polarized, i.e. the direction of the spin of an electron correlates with its propagation direction. Due to the properties of the weak topological insulator, each electron channel 15 has a quantized conductance of $e^2/h$ (h being the Planck constant), which does not substantially depend on the length, the depth or the width of the groove 12. Therefore, the length of the first channel layer 10 mentioned above can be largely increased without affecting the conductance at least up to the mean free path length which is of the order of several hundred of nanometers at room temperature. The total conductance of the first channel layer 10 is roughly proportional to the number of grooves 12. Due to the presence of the ridges 13 between the grooves 12 and due to the width of the grooves 12 themselves, there is normally no or only negligible electrical current between two neighboring conducting zones 14, i.e. these conducting zones 14 are electrically insulated.

Figure 5:
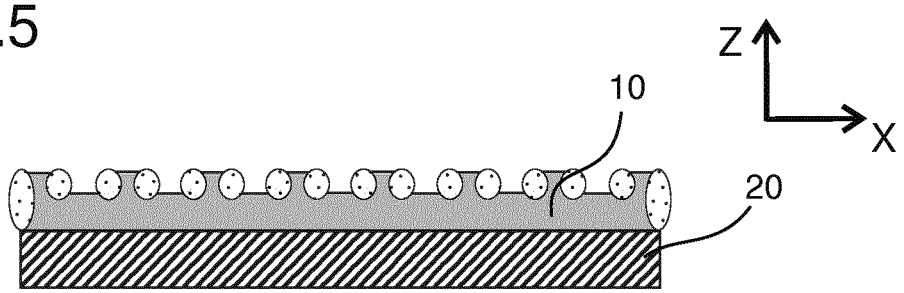
FIG. 5 is a cross-sectional view of a channel layer and an insulating layer.
Figure 6:
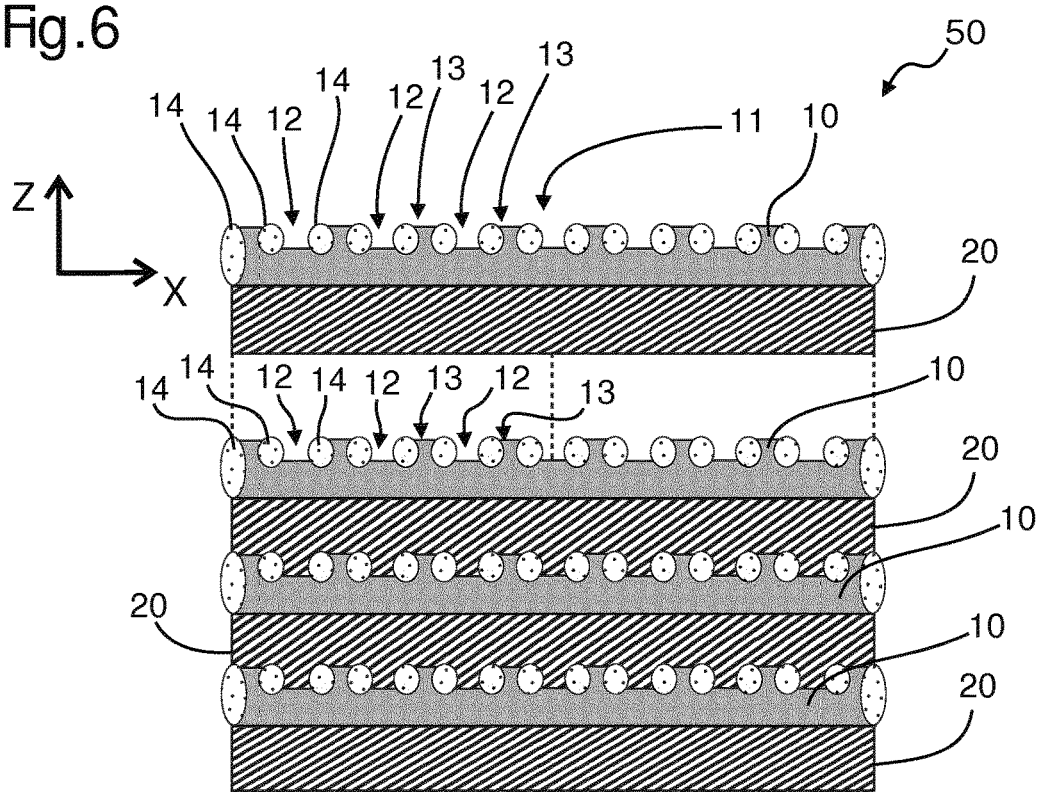
FIG. 6 is a cross-sectional view of a channel portion comprising a plurality of channel layers and insulating layers.

FIG. 5 shows the first channel layer 10 as in FIGS. 1 to 4 placed on top of an insulating layer 20 made of an electrically insulating material, in this case silicon dioxide. By repeatedly placing the structure shown in FIG. 5 above each other, a channel portion 50 as shown in FIG. 6 can be produced. In such a channel portion 50, a plurality of identical first channel layers 10 are arranged in a stacked manner above each other (i.e. along the Z-axis). One of a plurality of insulating layers 20 is interposed between each two neighboring first channel layers 10. The insulating material also fills the grooves 12, but due to its insulating properties, there is only negligible current flow between neighboring conducting zones 14. It is understood that by stacking a plurality of first channel layers 10, each of which comprises a plurality of grooves 12, the total conductance of the channel portion 50 is considerably increased and the resistance decreased as compared to the single channel layer 10 shown in FIG. 1.

Figure 7:
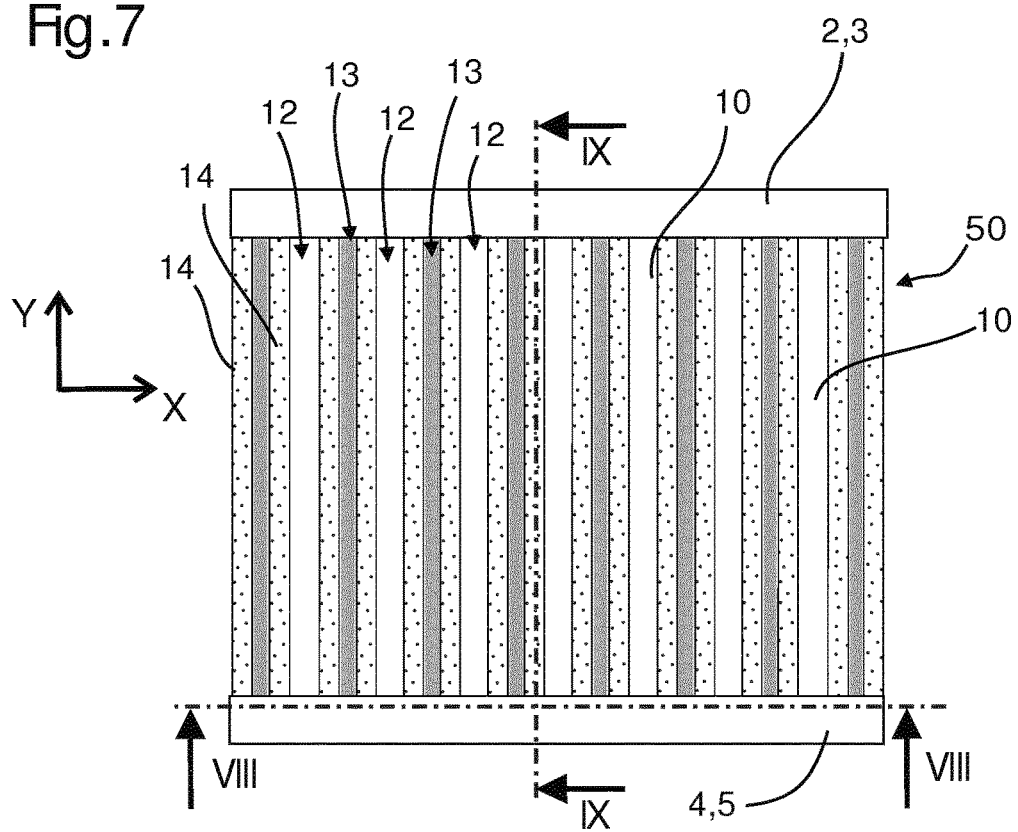
FIG. 7 is a top view of an electrical interconnection according to a first embodiment of the invention.
Figure 8:
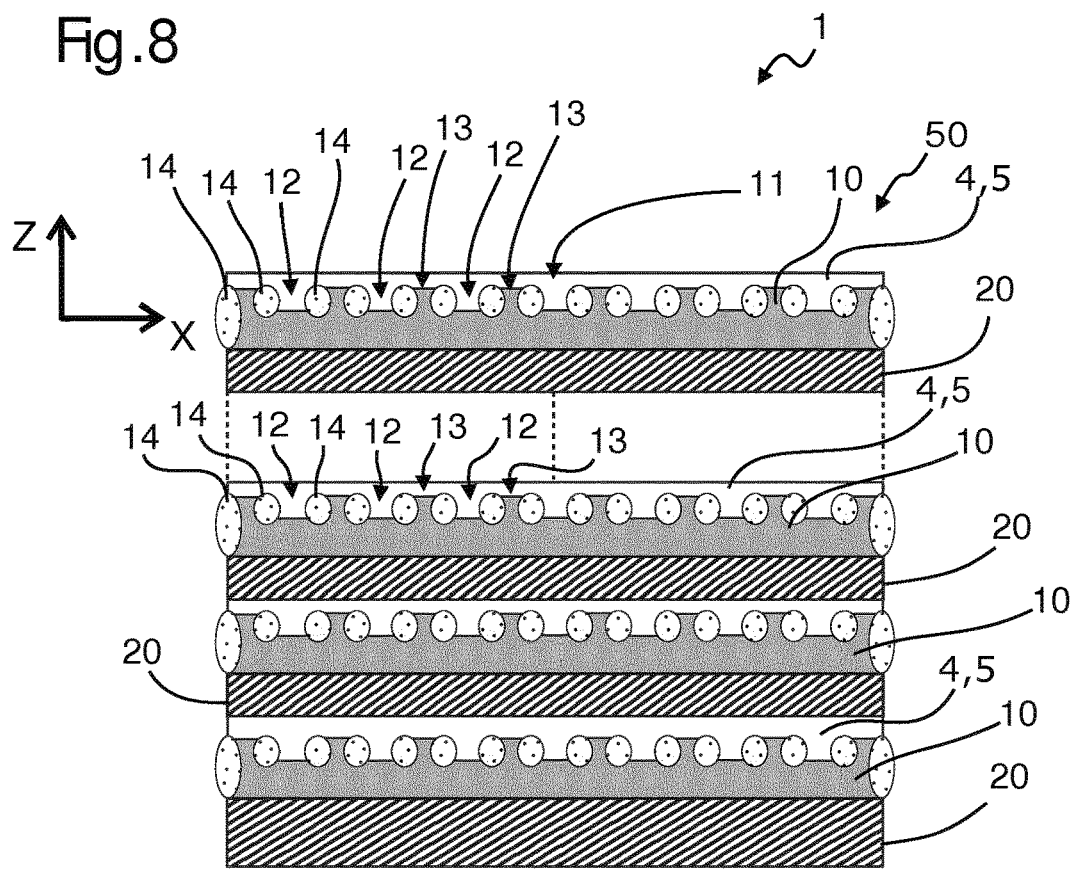
FIG. 8 is a cross-sectional view according to the line VIII-VIII in FIG. 7.
Figure 9:
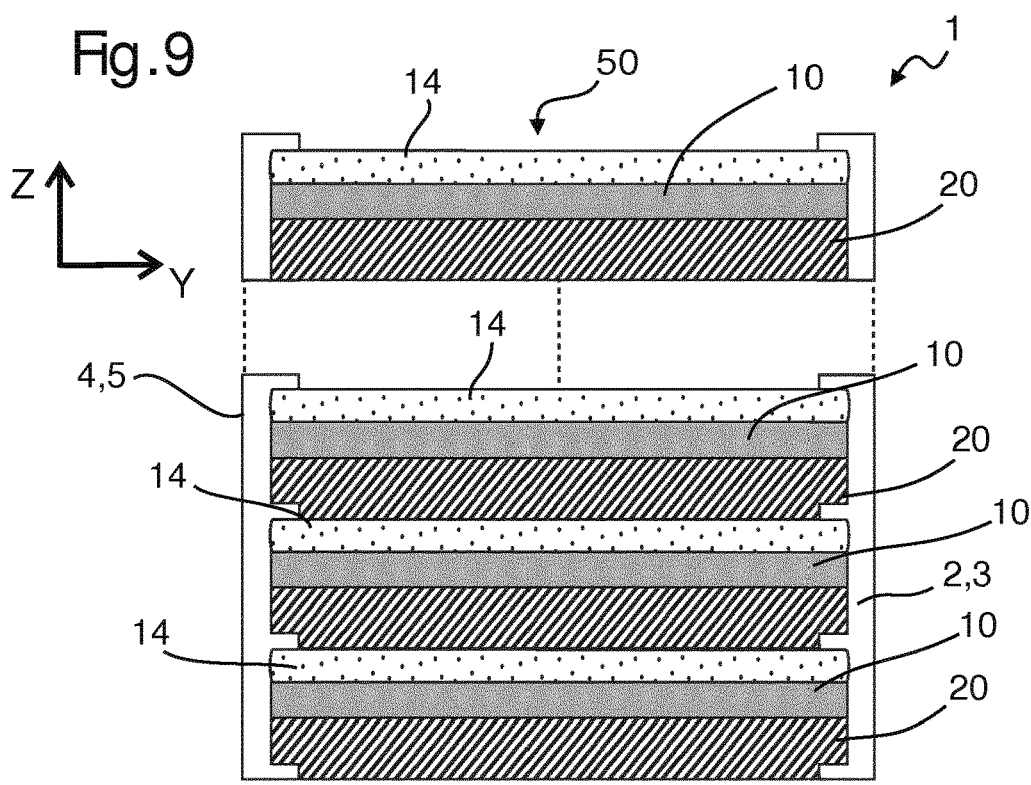
FIG. 9 is a cross-sectional view along the line IX-IX in FIG. 7.

FIGS. 7 to 9 show a first embodiment of an electrical interconnection 1 according to the present invention. It comprises a channel portion 50 that is similar to the one shown in FIG. 6. On two opposite sides of the channel portion 50 along the Y-axis, a first electrode 3 of a first terminal 2 and a second electrode 5 of a second terminal 4 are connected to the channel portion 50. The electrodes 3, 5 may consist of metals known in electronic applications like copper, aluminium, gold or the like and can be grown by additive processes directly on the channel layers 10. All grooves 12 of all first channel layers 10 extend from the first electrode 3 to the second electrode 5. In other words, all grooves 12 are connected in parallel between the first electrode 3 and the second electrode 5. The electrical interconnection 1 can be used, e.g. as part of an integrated circuit, to electrically connect a first electronic component (which is connected to the first terminal 2) with a second electronic component (which is connected to the second terminal 4).

Figure 10:
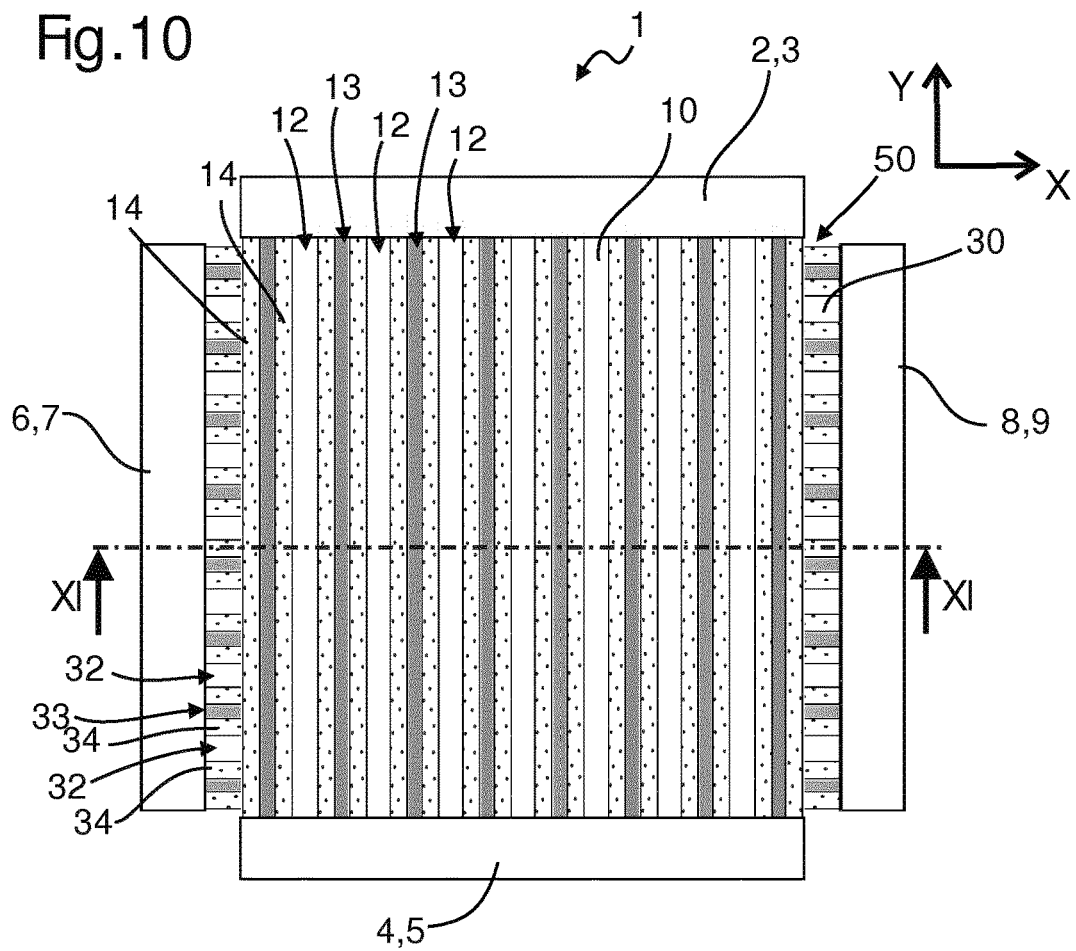
FIG. 10 is a top view of an electrical interconnection according to a second embodiment of the invention.
Figure 11:
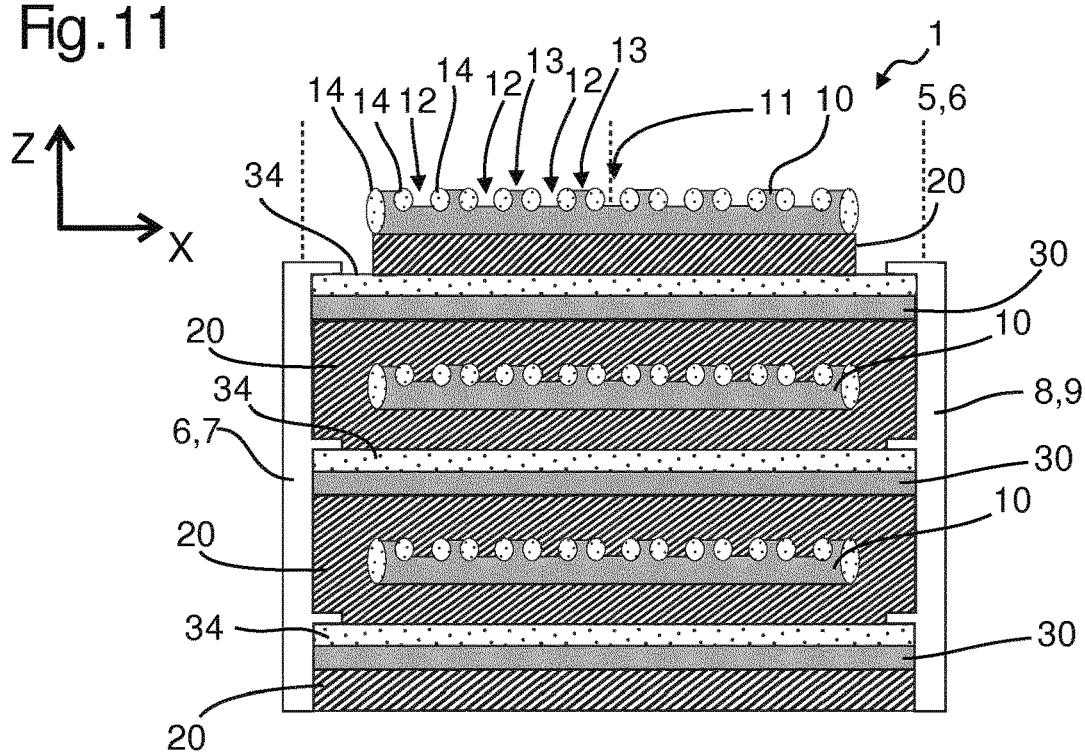
FIG. 11 is a cross-sectional view according to the line XI-XI in FIG. 10.

FIGS. 10 and 11 show a second embodiment of an electrical interconnection 1 according to the present invention. It comprises a plurality of first channel layers 10 and a plurality of second channel layers 30. The channel layers 10, 30 are disposed in a stacked manner with insulating layers 20 separating neighboring channel layers 10, 30. The overall structure of the second channel layers 30 is very similar to the first channel layers 10. However, while the grooves 12 of the first channel layers 10 run along the Y-axis, grooves 32 of the second channel layers 30 run along the X-axis. These grooves 32 also comprise conducting zones 34 and are separated by ridges 33. All grooves 12 of the first channel layers 10 extend from the first electrode 3 to the second electrode 5, while all grooves 32 of the second channel layers 30 extend from a third electrode 7 of a third terminal 6 to a fourth electrode 9 of a fourth terminal 8. These electrodes 7, 9 may be manufactured like the first and second electrode 3, 5. As can be seen in FIG. 11, all conducting zones 14, 34 are separated from each other by insulating material. Also, each first channel layer 10 is separated from the third and fourth electrode 7, 9 by insulating material and each second channel layer 30 is separated from the first and second electrode 3, 5 by insulating material.

The invention claimed is:

1. An electrical interconnection having a channel portion which comprises a channel layer made of a weak topological insulator material or any other three-dimensional topological insulator material which exhibits topologically protected one-dimensional electron channels and having a top surface with a plurality of grooves extending from a first terminal to a second terminal of the electrical interconnection, wherein the top surface and a bottom surface of each groove are insulating, whereas each side surface of each groove comprises a conducting zone with a pair of topologically protected one-dimensional electron channels.

2. The electrical interconnection according to claim 1, wherein the first terminal comprises a first electrode made of metal and the second terminal comprises a second electrode made of metal, wherein the grooves of the channel layer extend from the first electrode to the second electrode.

3. The electrical interconnection according to claim 1, wherein all grooves of the channel layer are spaced apart.

4. The electrical interconnection according to claim 1, wherein some of the grooves of the channel layer run parallel.

5. The electrical interconnection according to claim 1, wherein the electrical interconnection comprises a plurality of channel layers arranged in a stacked manner.

6. The electrical interconnection according to claim 5, wherein some of the grooves in a plurality of different channel layers among the plurality of channel layers run parallel.

7. The electrical interconnection according to claim 5, wherein two neighboring channel layers among the plurality of channel layers are separated by an insulating layer, which comprises an insulating material different from the topological insulator material.

8. The electrical interconnection according to claim 7, wherein the insulating material has a relative permittivity of less than 10.

9. The electrical interconnection according to claim 7, wherein the insulating material has a relative permittivity of less than 5.

10. The electrical interconnection according to claim 5, wherein the electrical interconnection comprises a first channel layer of the plurality of channel layers having grooves extending from the first terminal to the second terminal and a second channel layer of the plurality of channel layers having grooves extending from a third terminal to a fourth terminal of the electrical interconnection.

11. The electrical interconnection according to claim 10, wherein the third terminal comprises a third electrode made of metal and the fourth terminal comprises a fourth electrode made of metal.

12. The electrical interconnection according to claim 10, wherein each first channel layer is separated from the third and fourth terminal by the insulator material and each second channel layer is separated from the first and second terminal by the insulator material.

13. The electrical interconnection according to claim 10, wherein the first and second channel layers are disposed alternatingly.

14. An integrated circuit, comprising the electrical interconnection according to claim 1.

* * * * *